(12) United States Patent
Pan et al.

(10) Patent No.: US 6,794,615 B2
(45) Date of Patent: Sep. 21, 2004

(54) SEMICONDUCTOR WAFER TRAY POSITIONING

(75) Inventors: Jeng-Yang Pan, Jahei (TW); Hung-Fa Chen, Kaohsiung (TW)

(73) Assignee: Taiwan SEmiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/013,089

(22) Filed: Dec. 7, 2001

(65) Prior Publication Data

US 2003/0107125 A1 Jun. 12, 2003

(51) Int. Cl.[7] .............................................. F27D 11/00
(52) U.S. Cl. ..................................... 219/390; 438/663
(58) Field of Search ................................ 219/385, 390, 219/391, 402, 405; 118/725; 156/345.51; 438/663, 664

(56) References Cited

U.S. PATENT DOCUMENTS

| | | | | |
|---|---|---|---|---|
| 4,676,008 A | * | 6/1987 | Armstrong | 34/237 |
| 5,020,476 A | * | 6/1991 | Bay et al. | 118/728 |
| 5,820,367 A | * | 10/1998 | Osawa | 432/253 |
| 6,051,512 A | * | 4/2000 | Sommer et al. | 438/795 |
| 6,062,853 A | * | 5/2000 | Shimazu et al. | 432/258 |
| 6,310,328 B1 | * | 10/2001 | Gat | 219/411 |
| 6,344,387 B1 | * | 2/2002 | Hasebe et al. | 438/240 |
| 6,472,294 B2 | * | 10/2002 | Meuris et al. | 438/458 |
| 2003/0019585 A1 | * | 1/2003 | Tometsuka | 156/345.51 |
| 2003/0029570 A1 | * | 2/2003 | Kawamura et al. | 156/345.51 |

* cited by examiner

Primary Examiner—Carl Whitehead, Jr.
Assistant Examiner—Jennifer M Dolan
(74) Attorney, Agent, or Firm—Tung & Associates

(57) ABSTRACT

Semiconductor wafer tray positioning, such as can be used in rapid thermal processing (RTP), rapid thermal annealing (RTA), and other semiconductor fabrication processes, is disclosed. A housing, such as a quartz tube, to receive a wafer tray includes at least four positioning kits. Each positioning kit includes a primary outside edge and an inside edge. The primary outside edge at least substantially corresponds to an interior sidewall of the housing. The inside edge is opposite of the primary outside edge, and has a groove that at least substantially corresponds to a part of a frame of the wafer tray. The groove is receptive to the part of the frame of the wafer tray, to assist maintaining the wafer tray in a stable position when the tray is completely positioned in the housing.

9 Claims, 6 Drawing Sheets

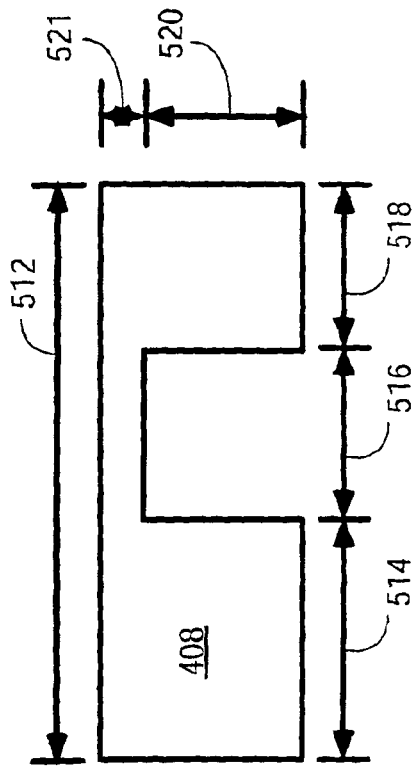
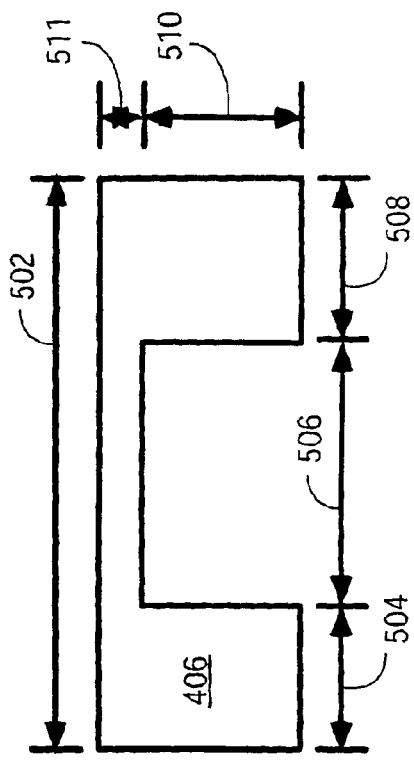
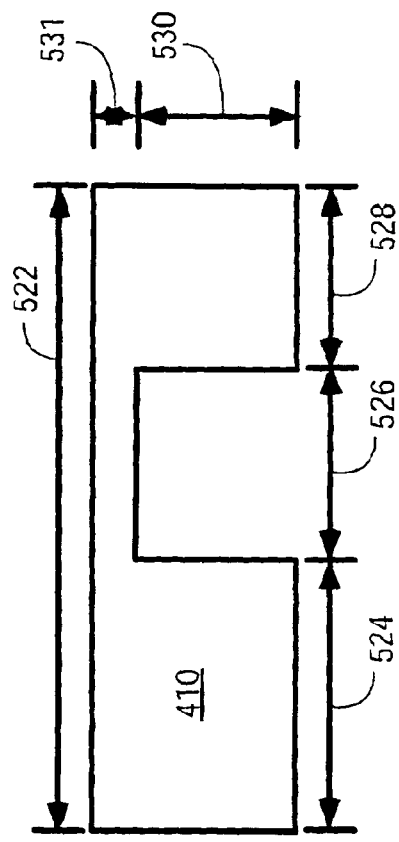

SEMICONDUCTOR WAFER TRAY POSITIONING

FIELD OF THE INVENTION

This invention relates generally to semiconductor device fabrication, and more particularly to wafer trays on which semiconductor wafers are placed for processing for such fabrication.

BACKGROUND OF THE INVENTION

In semiconductor device fabrication, doping is a frequently used process. Doping is the introduction of an impurity, the dopant, into the crystal lattice of a semiconductor to modify its electronic properties. For example, adding boron to silicon makes the material a p-type material. The dopant is thus an element that alters the conductivity of a semiconductor by contributing either a hole or an electron to the conduction process. In thermal diffusion, dopant atoms diffuse into the wafer surface by heating the wafer, and exposing it to vapors containing the desired dopant. In ion implantation, selected dopants are introduced by high-voltage ion bombardment to achieve desired electronic properties in defined areas.

Ion implantation has largely replaced thermal diffusion for doping, due to its inherent better doping control. However, ion implantation needs a follow-on heating operation, called annealing, to cure out crystal damage induced by the implant process. Annealing has traditionally been accomplished in a tube furnace. Although the heating anneals out the crystal damage, it also causes the dopant atoms to spread out in the wafer, which is undesirable. As a result, rapid thermal processing (RTP), such as rapid thermal annealing (RTA), technologies have been developed to supplant tube furnace utilization.

RTP and RTA technology is based on the principle of radiation heating. The semiconductor wafer is placed in a chamber fitted with gas inlets and exhaust outlets. Inside, a heat source above, and possibly below, the wafer provides the rapid heating. Heat sources include graphite heaters, microwave, plasma arc, and tungsten halogen lamps. The radiation from the heat source couples into the wafer surface and brings it up to a process temperature at rates of 75 to 125° C. per second. Cooling likewise occurs in seconds. With radiation heating, because of its short heating times, the body of the wafer never rises to the processing temperature. For ion implantation annealing, this means that crystal damage is annealed while the implanted atoms stay in their desired original locations.

FIG. 1 shows an exploded view of an example RTP or RTA assembly 100. The assembly 100 includes a reactor block 102 that has side lamps 104 which heat the wafer on the wafer tray 106. The wafer tray 106 is inserted inside a quartz tube 108 that fits inside the reactor block 102, where the quartz tube 108 enables the heat from the side lamps 104 to reach the wafer on the wafer tray 106. A compression plate 110 seals the quartz tube 108 in the radiator block 102. A door aperture 112 closes to seal the wafer tray 106 inside the quartz tube 108, once the wafer tray 106 has been inserted into the quartz tube 108 in the radiator block 102.

FIG. 2 shows a side cross-sectional view of the assembly 100. Gas is inlet through the inlet 204 of the radiator block 102, and is distributed over the wafer 206 on the wafer tray 106. The radiator block may be water-cooled. The quartz tube 108 surrounds the wafer tray 106 as before, and the wafer tray 106 has slip-guard rings 210 and 212 to desirably prevent slippage of the wafer 206. A window 208 lies within the bottom side of the quartz tube 108, to assist the light from the lamps 104 in heating the wafer 206. An inlet in the top of the radiator block 102 allows for additional nitrogen or air, or another gas, to be inserted as needed. A temperature sensor 212, such as a pyrometer, accomplishes temperature measurement. An outlet 214 allows exit of the exhaust gases. The door aperture 112 seals the wafer 206 within the radiator block 102 as before, and has o-ring seals 216 and 218 to assist its sealing.

A disadvantage to existing RTA and RTP assemblies, such as the assembly 100 of FIGS. 1 and 2, and such as those available from Advanced Semiconductor Technologies (AST), Ltd., of Ra'anana, Israel, is that they do not provide a wafer-positioning system (WPS). This means that semiconductor wafers cannot be precisely placed within the RTA and RTP assemblies, and their positions within the assemblies cannot also be maintained. However, RTA and RTP are processes that are very sensitive to the position of the wafer, especially its relation to the lamps of the assemblies. As a result, existing RTA and RTP assemblies often suffer from unstable temperature profiles, due to the semiconductor wafers being out of position inside the reactor blocks of the assemblies. This can cause problems within the RTA and RTP processes themselves.

Therefore, there is a need for semiconductor wafer tray positioning that overcomes these disadvantages. Specifically, there is a need for semiconductor wafer tray positioning that allows for more precise placement of semiconductor wafers within RTA and RTP assemblies. Such wafer tray positioning should ensure stable temperature profiles of the assemblies, as well as ensure process uniformity. For these and other reasons, there is a need for the present invention.

SUMMARY OF THE INVENTION

The invention relates to semiconductor wafer tray positioning. A housing, such as a quartz tube, to receive a wafer tray includes at least four positioning kits. Each positioning kit includes a primary outside edge and an inside edge. The primary outside edge at least substantially corresponds to an interior sidewall of the housing. The inside edge is opposite of the primary outside edge, and has a groove that at least substantially corresponds to a part of a frame of the wafer tray. The groove is receptive to the part of the frame of the wafer tray, to assist maintaining the wafer tray in a stable position when the tray is completely positioned in the housing.

The invention provides for advantages over the prior art. More precise placement of semiconductor wafers within rapid thermal annealing (RTA) and rapid thermal processing (RTP) assemblies is achieved by using the positioning kits of the invention. Use of the positioning kits to achieve such precise placement of wafers ensures stable temperature profiles of the assemblies, leading to process uniformity. Still other advantages, aspects, and embodiments of the invention will become apparent by reading the detailed description that follows, and by referencing the accompanying drawings.

BRIEF DESCRIPTION OF THE DRAWINGS

FIGS. 5A, 5B, and 5C are side-profile cross-sectional diagrams of the positioning kits shown in FIG. 4, detailing specifically their shape in accordance with an embodiment of the invention.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
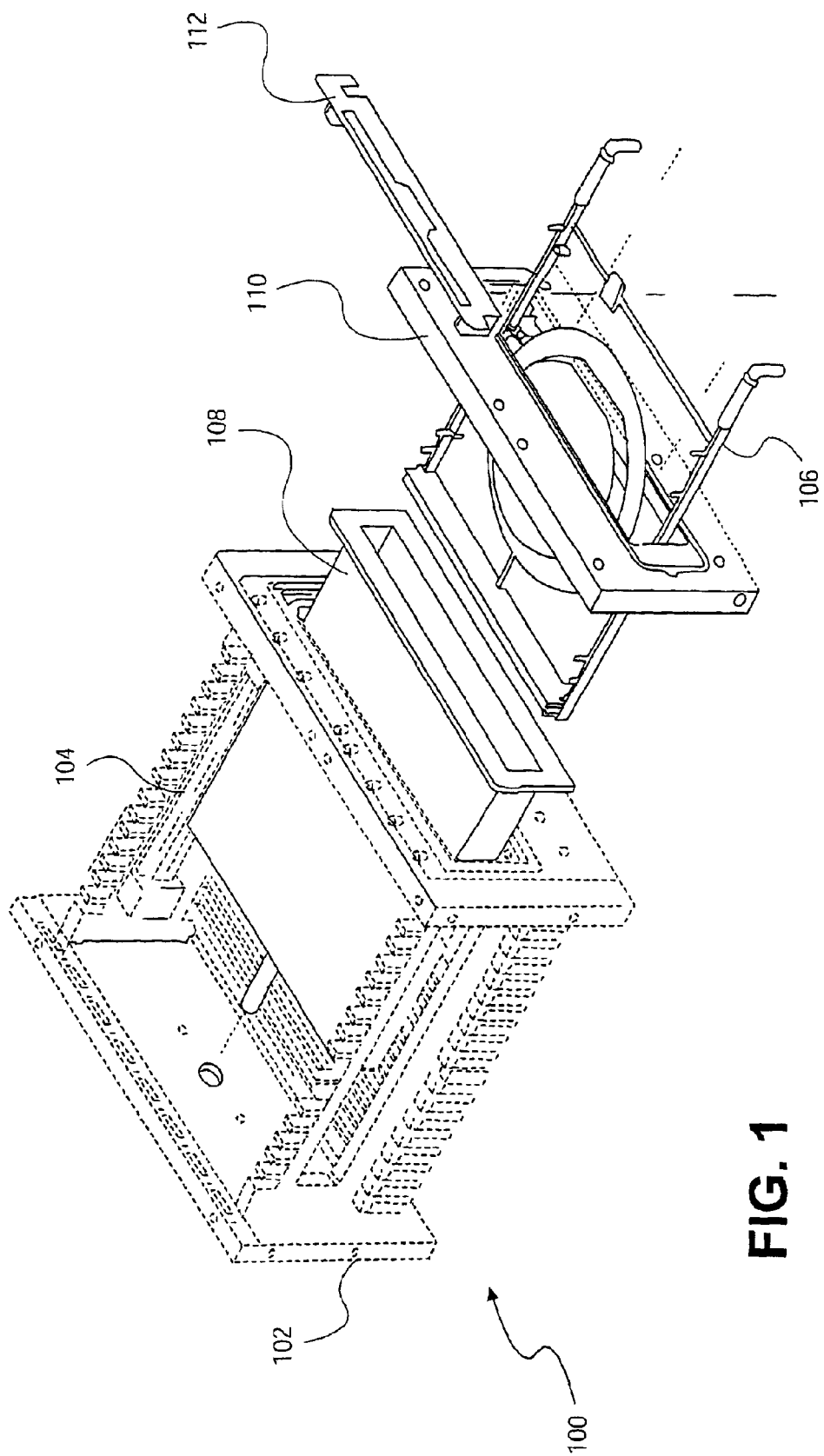
FIG. 1 is a diagram of an example process chamber for rapid thermal annealing (RTA), and which exhibits unstable temperature profile due to imprecise wafer positioning within the chamber when the inventive positioning kits are not utilized therewith.
Figure 2:
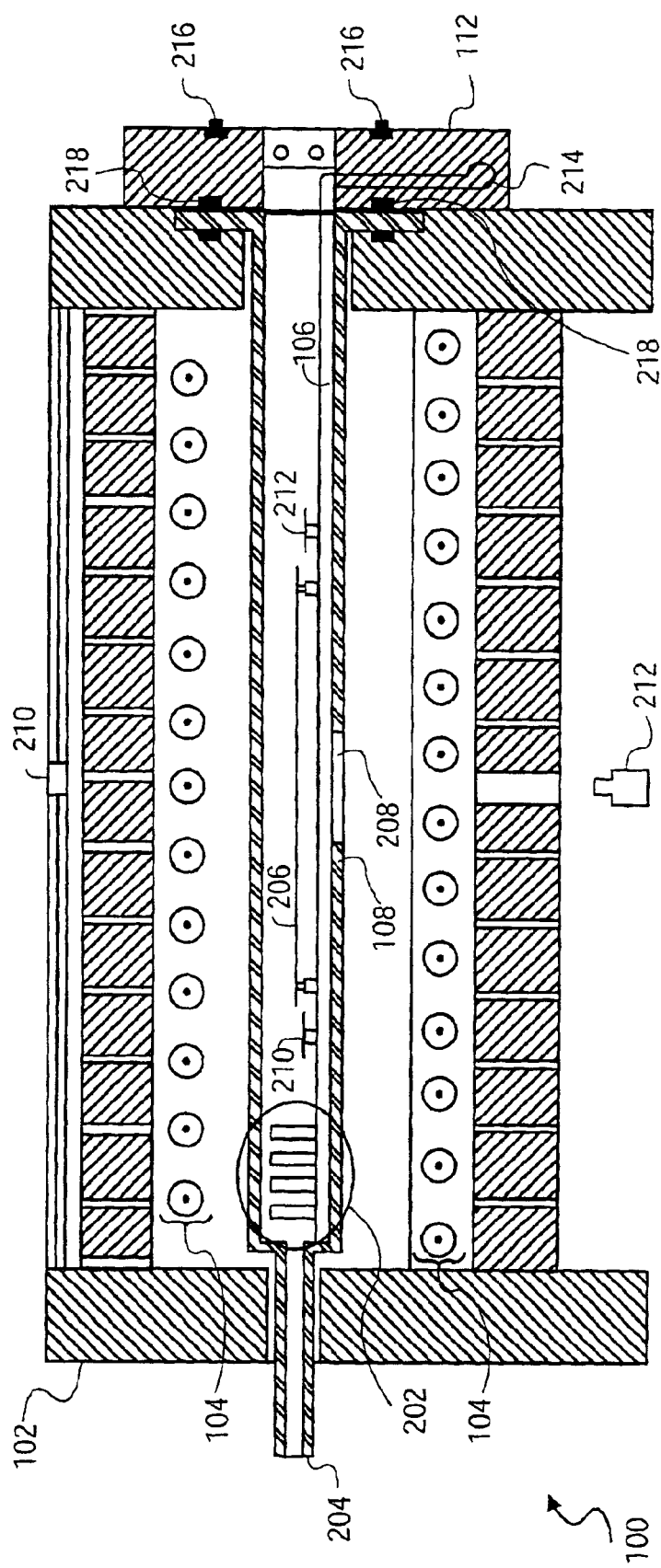
FIG. 2 is a side-profile cross-sectional diagram of the process chamber of FIG. 1, showing parts of the chamber in more detail.
Figure 3:
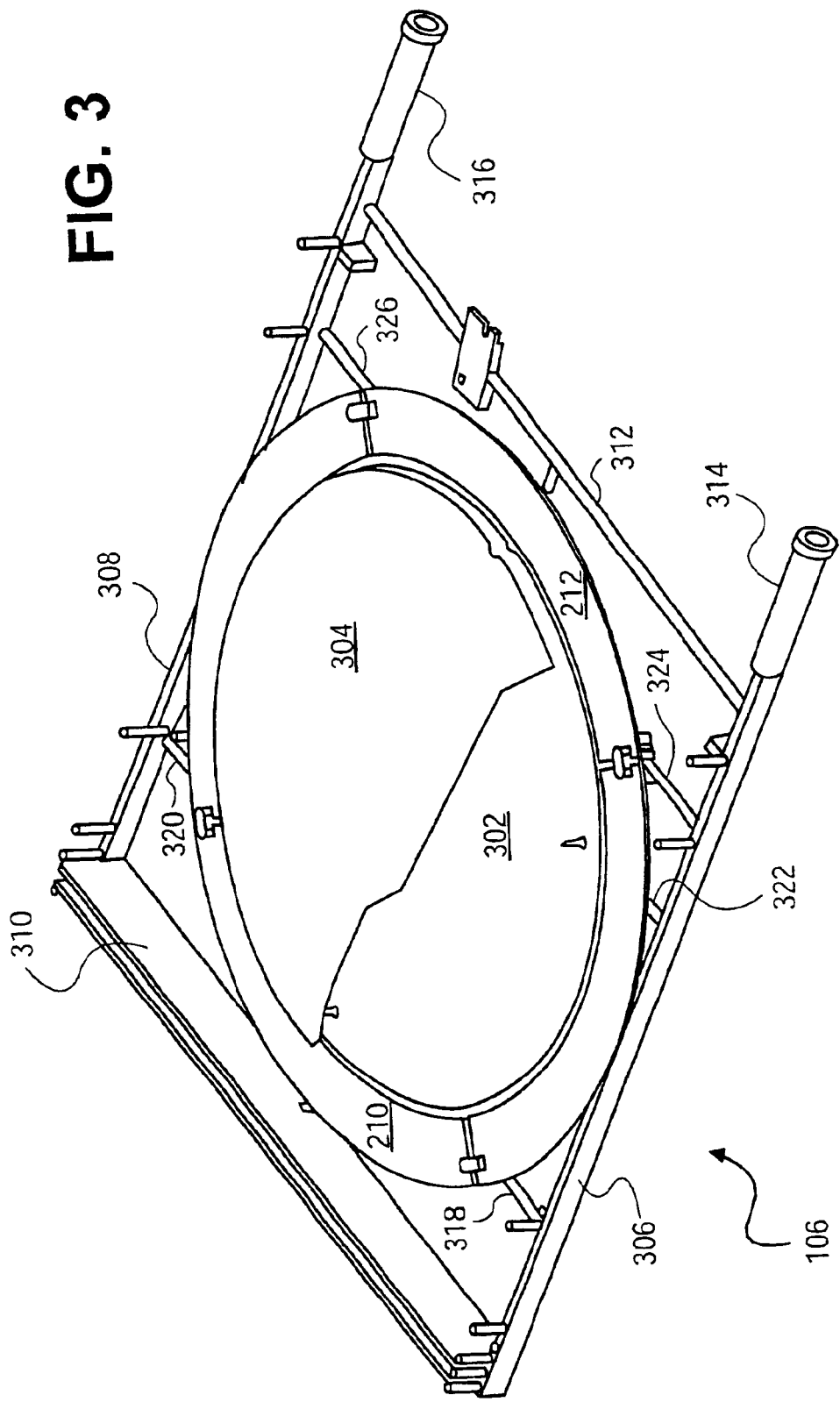
FIG. 3 is a diagram of a wafer tray that can be used in the process chamber of FIG. 1, and in conjunction with which embodiments of the invention may be practiced or otherwise implemented.

FIG. 3 shows a sample semiconductor wafer tray 106 in conjunction with which embodiments of the invention can be implemented. The wafer tray 106 is insertable into a housing of an assembly, such as the quartz tube 108 of the rapid thermal processing (RTP) or rapid thermal annealing (RTA) assembly 100 of FIGS. 1 and 2. The tray 106 includes a liner 302 on which a semiconductor wafer 304 sits. When the wafer tray 106 is inserted into an assembly, the wafer 304 is processed in accordance with the functionality of the assembly. The slip-guard rings 210 and 212 prevent slippage of the wafer 304 off the tray 106. The wafer tray 106 has a left side frame rail 306 and a right side frame rail 308. It also has a back frame rail 310, and a front frame rail 312. Left and right handles 314 and 316, respectively, allow for the tray 106 to be inserted into and removed from an assembly. The frame of the rail is made up of the frame rails 306, 308, 310, and 312 in one embodiment. Extension pins 318, 320, 322, 324, and 326 support the wafer 304 on the wafer tray 106.

Figure 4:
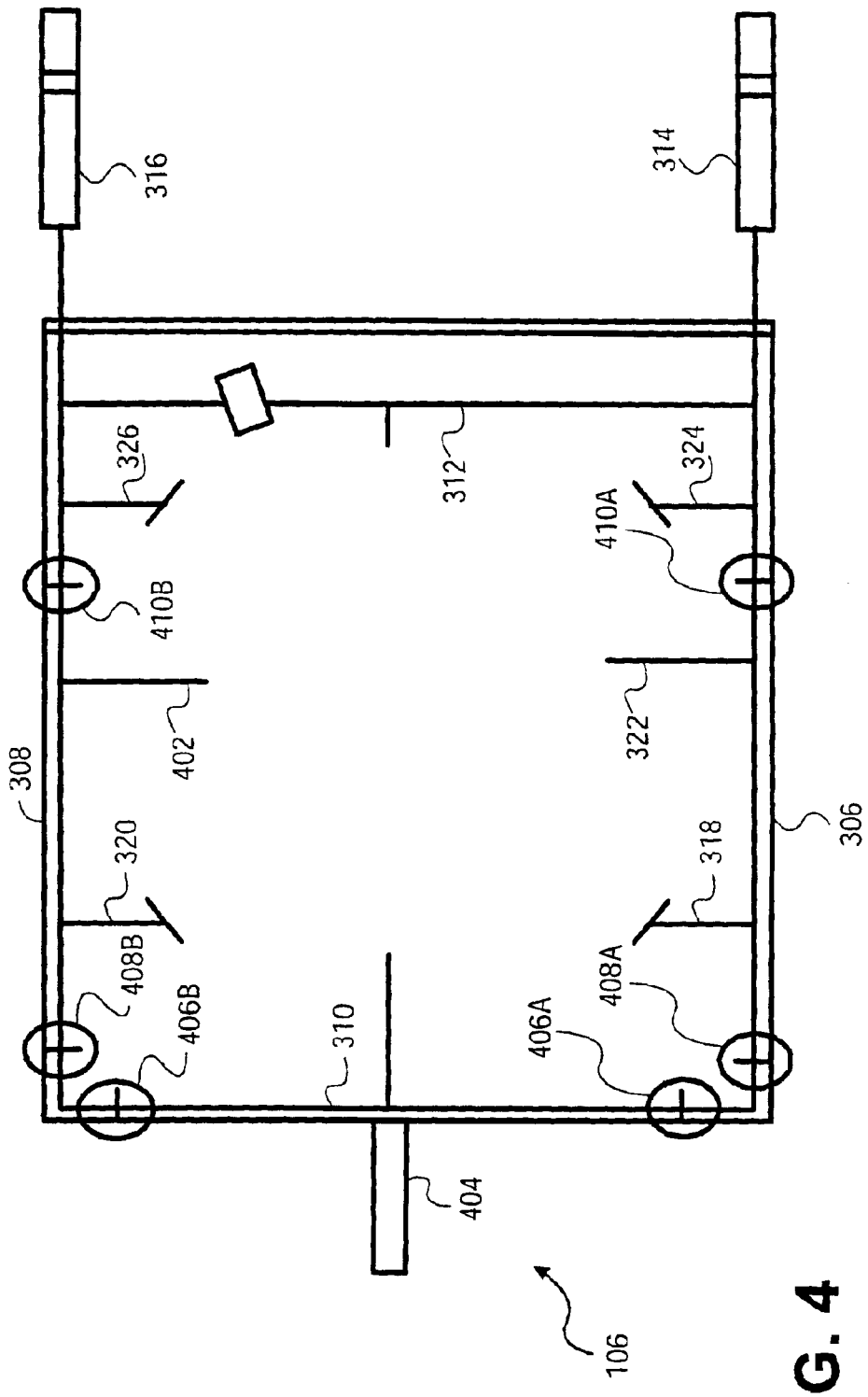
FIG. 4 is a top-view cross-sectional diagram of the wafer tray of FIG. 3, where the wafer tray has been fitted into positioning kits according to an embodiment of the invention to assist in maintaining positional stability of the wafer tray, and hence positional stability of the semiconductor wafer placed on the tray as well.

FIG. 4 shows where positioning kits according to an embodiment of the invention are placed to prevent the wafer tray 106 from becoming misaligned or otherwise out of position when in an assembly. Specifically, back positioning kits 406a and 406b hold the back frame rail 310 from moving, and thus assist in maintaining the wafer tray 106 in a stable position. The left and right rear positioning kits 408a and 408b hold the left side frame rail 306 and the right side frame rail 308 near the corners where the back frame rail 310 meets the rails 306 and 308, respectively. The right and left front positioning kits 410a and 410b hold the left side frame rail 306 and the right side frame rail 308 nearer where the wafer tray 106 first enters the housing of the assembly. Also shown in FIG. 4 is an additional extension pin 402, opposite of the pin 322, which cannot be seen in FIG. 3. An alignment guide 404 assists alignment of the wafer tray 106 when inserted into a housing of an assembly.

FIGS. 5A, 5B, and 5C show the positioning kits 406a and 406b, 408a and 408b, and 410a and 410c, respectively, in more detail. In FIG. 5A, the positioning kit 406 generally refers to either or both of the kits 406a and 406b of FIG. 4. As shown in FIG. 5A, the kit 406 has a primary outside edge corresponding to the dimension 502, which at least substantially corresponds to an interior sidewall of a housing in which the wafer tray is to be inserted. That is, the dimension 502 corresponds to the height of the housing at a particular location thereof, such that the primary outside edge is affixed thereto. The inside edge of the kit 406 corresponds to the dimensions 504, 506, and 508, where the dimension 506 corresponds to a groove within the inside edge. The inside edge is denoted as such because it faces the hole in the housing that receives the wafer tray, whereas the primary outside edge is denoted as such because it faces away from the hole, and towards the interior wall of the housing.

The groove at least substantially corresponds to the height of the back frame rail 310 of FIGS. 3 and 4, such that the groove is receptive to the back frame rail 310. That is, the groove of the inside edge preferably mirrors the back frame rail 310, such that the rail 310 snugly fits inside the groove, maintaining the wafer tray in a stable position. As depicted in FIG. 5A, the positioning kit 406 has a substantially C shape, and the groove is substantially rectangular in shape. The dimensions 502, 504, 506, 508, 510, and 511 can in one embodiment be 10.0, 2.7, 4.5, 2.8, 7.0, and 3.0 millimeters (mm), respectively. The thickness of the kit 406 can be less than one mm.

In FIG. 5B, the positioning kit 408 generally refers to either or both of the kits 408a and 408b of FIG. 4. As shown in FIG. 5B, the kit 408 has a primary outside edge corresponding to the dimension 512, which at least substantially corresponds to an interior sidewall of a housing in which the wafer tray is to be inserted. That is, the dimension 512 corresponds to the height of the housing at a particular location thereof, such that the primary outside edge is affixed thereto. The inside edge of the kit 408 corresponds to the dimensions 514, 516, and 518, where the dimension 516 corresponds to a groove within the inside edge. The inside edge is denoted as such because it faces the hole in the housing that receives the wafer tray, whereas the primary outside edge is denoted as such because it faces away from the hole, and towards the interior wall of the housing.

The groove at least substantially corresponds to the height of the side rails 306 and 308 of FIGS. 3 and 4, such that the groove is receptive to one of these rails. That is, the groove of the inside edge preferably mirrors one of the rails 306 and 308, such that this rail snugly fits inside the groove, maintaining the wafer tray in a stable position. As depicted in FIG. 5B, the positioning kit 408 has a substantially C shape, and the groove is substantially rectangular in shape. The dimensions 512, 514, 516, 518, 520, and 521 can in one embodiment be 17.0, 8.0, 4.5, 4.5, 7.0, and 3.0 mm, respectively. The thickness of the kit 408 can be less than one mm.

In FIG. 5C, the position kit 410 generally refers to either or both of the kits 410a and 410b of FIG. 4. As shown in FIG. 5C, the kit 410 has a primary outside edge corresponding to the dimension 522, which at least substantially corresponds to an interior sidewall of a housing in which the wafer tray is to be inserted. That is, the dimension 512 corresponds to the height of the housing at a particular location thereof, such that the primary outside edge is affixed thereto. The inside edge of the kit 410 corresponds to the dimension 524, 526, and 528, where the dimension 526 corresponds to a groove within the inside edge. The inside edge is denoted as such because it faces the hole in the housing that receives the wafer tray, whereas the primary outside edge is denoted as such because it faces away from the hole, and towards the interior wall of the housing.

The groove at least substantially corresponds to the height of the side rails 306 and 408 of FIGS. 3 and 4, such that the groove is receptive to one of these rails. That is, the groove of the inside edge preferably mirrors one of the rails 306 and 308, such that this rail snugly fits inside the groove, maintaining the wafer tray in a stable position. As depicted in FIG. 5C, the positioning kit 410 has a substantially C shape, and the groove is substantially rectangular in shape. The dimensions 522, 524, 526, 528, 530, and 531 can in one embodiment be 17.0, 8.0, 4.5, 4.5, 7.0, and 3.0 mm, respectively. The thickness of the kit 410 can be less than one mm.

Figure 6:
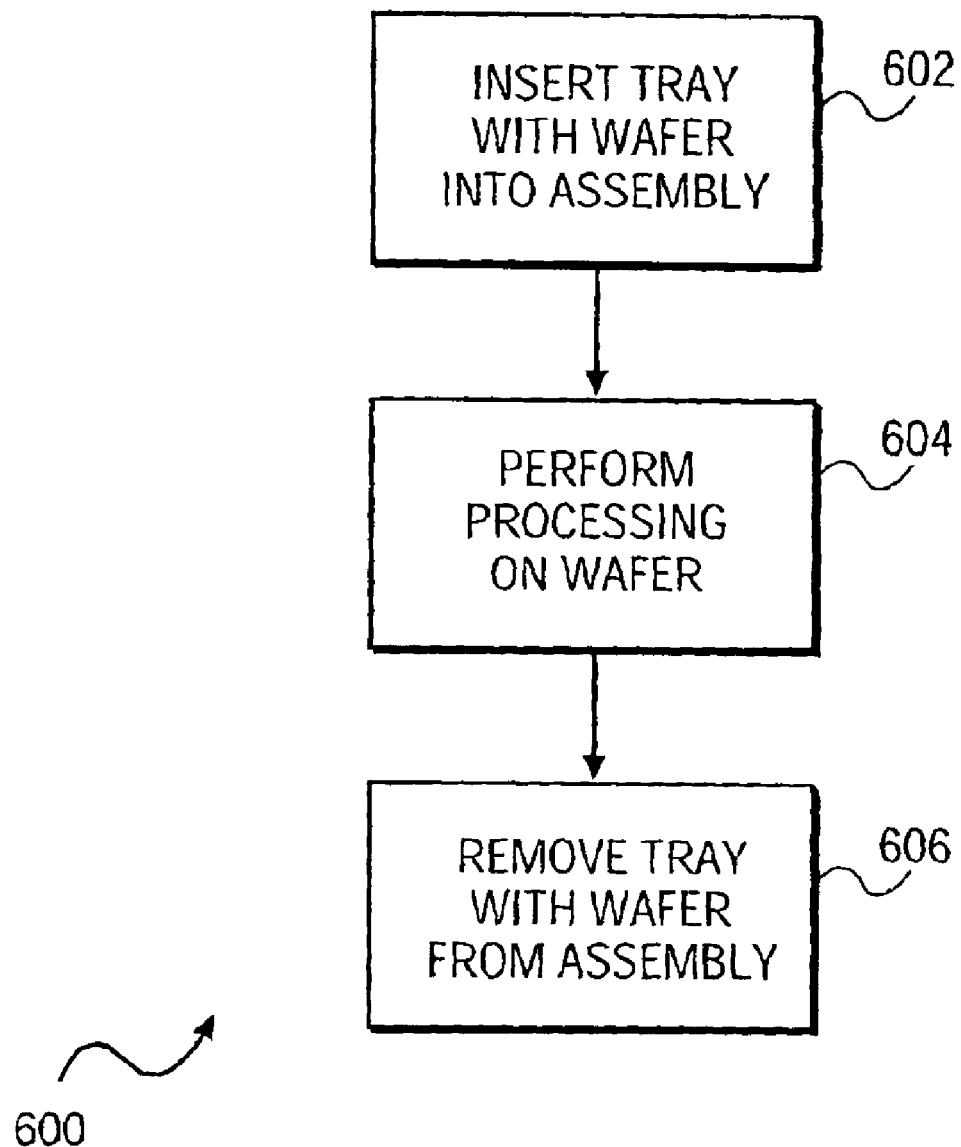
FIG. 6 is a flowchart of a method according to an embodiment of the invention.

FIG. 6 shows a method 600 according to an embodiment of the invention. First, a semiconductor wafer tray is inserted into a housing, such as a quartz tube, of a semiconductor fabrication assembly, such as an RTA or an RTP assembly (602). A frame of the wafer tray fits snugly into grooves of at least four positioning kits fixed inside the housing. Next, a semiconductor fabrication process is performed on a semiconductor wafer on the wafer tray, after the wafer tray has been completely inserted into the housing of the assembly (604). The wafer tray stays substantially stable position-wise during this process due to the frame of the wafer tray fitting snugly into the grooves of the kits. The process may be RTA, RTP, or another fabrication process. Finally, the tray is removed from the housing of the assembly (606), where the frame of the wafer tray slides out from the grooves of the positioning kits fixed inside the housing.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A housing to receive a semiconductor wafer tray comprising:
    at least four discrete positioning kits extending from interior sidewalls of the housing, each positioning kit comprising:
        a primary outside edge at least substantially corresponding to one of the interior sidewall of the housing; and,
        an inside edge opposite of the primary outside edge, and having a groove at least substantially corresponding to a part of a frame of the semiconductor wafer tray,
        the groove receptive to the part of the frame of the semiconductor wafer tray, to assist maintaining the semiconductor wafer tray in a stable position when the semiconductor wafer tray is completely positioned in the housing, wherein the housing comprises a quartz tube for a semiconductor fabrication rapid thermal process (RTP),
    wherein at least one of the four positioning kits each extend from a back interior sidewall of the interior sidewalls of the housing, at least one of the four positioning kits each extend from a first side interior sidewall of the interior sidewalls of the housing, and at least one of the four positioning kits each extend from a second side interior sidewall of the interior sidewalls of the housing, the second side interior sidewall opposite to the first side interior sidewall.

2. The housing of claim 1, wherein each positioning kit further comprises:
    an upper outside edge facing an interior upper wall of the housing; and,
    a lower outside edge facing an interior lower wall of the housing.

3. The housing of claim 1, wherein the primary outside edge of each positioning kit is fixed to the interior sidewall of the housing to which the primary outside edge at least substantially corresponds.

4. The housing of claim 1, wherein the groove of the inside edge of each positioning kit is shaped to mirror the part of the frame of the semiconductor wafer tray to which the groove substantially corresponds, such that the part of the frame fits snugly inside the groove.

5. The housing of claim 1, wherein the groove is substantially rectangular in shape.

6. The housing of claim 1, wherein each positioning kit is substantially shaped like a letter C.

7. A semiconductor fabrication rapid thermal processing (RTP) assembly comprising:
    a reactor block having a slot therein;
    a tube fitting in the slot of the reactor block;
    a wafer tray accepting a semiconductor wafer on which RTP is to be performed, the tray slidable into and out of the tube; and,
    at least four discrete positioning kits fixed inside the tube and extending from interior sidewalls of the tube, each positioning kit having a groove at least substantially corresponding to a part of the wafer tray and receptive to the part of the wafer tray when the tray is slid into the tube to assist maintaining the tray in a stable position within the tube during the RTP,
    wherein at least one of the four positioning kits each extend from a back interior sidewall of the interior sidewalls of the tube, at least one of the four positioning kits each extend from a first side interior of the interior sidewalls of the tube, and at least one of the four positioning kits each extend from a second side interior sidewall of the interior sidewalls of the tube, the second side interior sidewall opposite to the first side interior sidewall.

8. The assembly of claim 7, wherein the groove of each positioning kit is shaped to mirror the part of the wafer tray to which the groove substantially corresponds, such that the part of the frame fits snugly inside the groove.

9. The assembly of claim 7, wherein the RTP comprises rapid thermal annealing (RTA).

* * * * *